US012412736B2

(12) United States Patent
Belau et al.

(10) Patent No.: US 12,412,736 B2
(45) Date of Patent: Sep. 9, 2025

(54) METHODS AND SYSTEMS FOR MANAGING BYPRODUCT MATERIAL ACCUMULATION DURING PLASMA-BASED SEMICONDUCTOR WAFER FABRICATION PROCESS

(71) Applicant: Lam Research Corporation, Fremont, CA (US)

(72) Inventors: Leonid Belau, Pleasanton, CA (US); Alexei Marakhtanov, Albany, CA (US); Eric Hudson, Berkeley, CA (US); John Patrick Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 1022 days.

(21) Appl. No.: 16/147,231

(22) Filed: Sep. 28, 2018

(65) Prior Publication Data

US 2020/0105508 A1  Apr. 2, 2020

(51) Int. Cl.
*H01J 37/32* (2006.01)
*C23C 16/455* (2006.01)
*H01L 21/02* (2006.01)
*H01L 21/306* (2006.01)
*H01L 21/311* (2006.01)
(Continued)

(52) U.S. Cl.
CPC .. *H01J 37/32844* (2013.01); *C23C 16/45521* (2013.01); *H01J 37/32091* (2013.01); *H01J 37/32183* (2013.01); *H01J 37/32449* (2013.01); *H01J 37/32522* (2013.01); *H01J 37/32642* (2013.01); *H01J 37/32724* (2013.01); *H01J 37/32862* (2013.01); *H01L 21/02019* (2013.01); *H01L 21/02021* (2013.01); *H01L 21/02057* (2013.01); *H01L 21/30621* (2013.01); *H01L 21/311* (2013.01); *H01L 21/31105* (2013.01); *H01L 21/31116* (2013.01);
(Continued)

(58) Field of Classification Search
None
See application file for complete search history.

(56) References Cited

U.S. PATENT DOCUMENTS

2005/0026431 A1\* 2/2005 Kazumi ............ H01L 21/31116
438/689
2006/0254717 A1\* 11/2006 Kobayashi ........ H01L 21/68742
156/345.44
(Continued)

*Primary Examiner* — Parviz Hassanzadeh
*Assistant Examiner* — Margaret Klunk
(74) *Attorney, Agent, or Firm* — Penilla IP, APC

(57) ABSTRACT

A wafer is supported on a wafer support structure such that a lower peripheral open region exists between a peripheral portion of a bottom surface of the wafer and an edge ring structure. The edge ring structure is configured to circumscribe both the wafer support structure and the wafer. A plasma is generated above a top surface of the wafer. The plasma causes accumulation of byproduct material within the lower peripheral open region. A byproduct volatizing gas is supplied to the lower peripheral open region to control the accumulation of the byproduct material within the lower peripheral open region during generation of the plasma. Use of the byproduct volatizing gas to control the accumulation of the byproduct material within the lower peripheral open region serves to prevent electrical arcing and particle contamination.

18 Claims, 6 Drawing Sheets

(51) Int. Cl.
*H01L 21/67* (2006.01)
*H01L 21/687* (2006.01)

(52) U.S. Cl.
CPC .. *H01L 21/67253* (2013.01); *H01L 21/68735* (2013.01); *H01J 2237/3341* (2013.01)

(56) References Cited

U.S. PATENT DOCUMENTS

| | | | | |
|---|---|---|---|---|
| 2008/0194111 A1* | 8/2008 | Delgadino | .......... | H01L 21/0209 438/707 |
| 2008/0216959 A1* | 9/2008 | Kobayashi | ........ | H01L 21/67069 156/345.55 |
| 2008/0230096 A1* | 9/2008 | Kawamura | ....... | H01L 21/67023 134/90 |
| 2009/0203218 A1* | 8/2009 | Matsuyama | ...... | H01L 21/31116 438/719 |
| 2010/0099263 A1* | 4/2010 | Kao | .................. | H01J 37/32422 438/703 |
| 2015/0255316 A1* | 9/2015 | Dobashi | ............. | H01L 21/0209 134/37 |
| 2016/0079057 A1* | 3/2016 | Varadarajan | .......... | C23C 16/505 438/785 |

\* cited by examiner

METHODS AND SYSTEMS FOR MANAGING BYPRODUCT MATERIAL ACCUMULATION DURING PLASMA-BASED SEMICONDUCTOR WAFER FABRICATION PROCESS

BACKGROUND

1. Field of the Disclosure

The present disclosure relates to semiconductor device fabrication.

2. Description of the Related Art

Plasma etching processes are often used in the manufacture of semiconductor devices. In the plasma etching process, a semiconductor wafer that includes semiconductor devices under manufacture is exposed to a plasma within a plasma processing chamber. The plasma interacts with at least one material on the semiconductor wafer so as to remove the at least one material. The plasma can be generated using specific reactant gases that will cause constituents of the plasma to interact with the material(s) to be removed from the semiconductor wafer, without significantly interacting with other materials on the wafer that are not to be removed. During the plasma etching process, various byproduct materials can be generated that deposit on surfaces within the plasma processing chamber. Depending on the plasma etching process, it is possible for enough of the byproduct materials to accumulate on surfaces near the wafer to cause adverse conditions, such as electrical arcing and particle contamination. It is within this context that the present disclosure arises.

SUMMARY

A method is disclosed for managing byproduct accumulation during a plasma-based semiconductor wafer fabrication process. The method includes having a wafer supported on a wafer support structure such that a lower peripheral open region exists between a peripheral portion of a bottom surface of the wafer and an edge ring structure. The edge ring structure is configured to circumscribe both the wafer support structure and the wafer. The method includes generating a plasma above a top surface of the wafer. The plasma causes accumulation of byproduct material within the lower peripheral open region. The method includes supplying a byproduct volatizing gas to the lower peripheral open region to control the accumulation of the byproduct material within the lower peripheral open region during generation of the plasma in exposure to the top surface of the wafer.

A system for managing byproduct accumulation during a plasma-based semiconductor wafer fabrication process is disclosed. The system includes a wafer support structure configured to support a wafer during the plasma-based semiconductor wafer fabrication process. The system also includes an edge ring structure configured to circumscribe the wafer support structure such that a lower peripheral open region exists between the edge ring structure and a peripheral portion of a bottom surface of a wafer when the wafer is present on the wafer support structure. The system also includes a wafer backside cooling gas supply configured to supply a backside cooling gas to a region between the wafer support structure and the wafer when the wafer is present on the wafer support structure. The system also includes a byproduct volatizing gas supply configured to supply a byproduct volatizing gas to the lower peripheral open region. The byproduct volatizing gas is defined to control accumulation of a byproduct material within the lower peripheral open region during the plasma-based semiconductor wafer fabrication process.

DETAILED DESCRIPTION

In the following description, numerous specific details are set forth in order to provide an understanding of embodiments of the present disclosure. It will be apparent, however, to one skilled in the art that embodiments the present disclosure may be practiced without some or all of these specific details. In other instances, well known process operations have not been described in detail in order not to unnecessarily obscure the present disclosure.

Various embodiments of methods and systems are disclosed herein with reference to a plasma-based wafer fabrication process. In the semiconductor industry, wafers can undergo fabrication operations in various types of plasma chambers, such as capacitively coupled plasma (CCP) processing chambers and inductively coupled plasma (ICP) processing chambers. In both CCP and ICP processing chambers, radiofrequency (RF) power is used to energize a process gas to transform the process gas into a plasma within a plasma processing region to which the wafer is exposed. Reactive species and/or charged species within the plasma interact with the wafer to modify a condition of the wafer, such as by modifying a material present on the wafer, or by depositing material on the wafer, or by removing/etching material from the wafer, by way of example. The CCP and ICP processing chambers can be equipped with one or more electrodes that receive RF power for generating the plasma within the plasma processing region. Also, the CCP and ICP processing chambers can be equipped with one or more electrodes that receive RF power and/or direct current (DC) power to generate a bias voltage at the wafer location for attracting charged species from the plasma toward the wafer. Also, in some embodiments, the CCP and ICP processing chambers can be equipped with one or more electrically powered components, such as a heater assembly, that receive electrical power from one or more power supplies, where each of the one or more power supplies is either a DC power supply or an AC (alternating current) power supply.

Figure 1A:
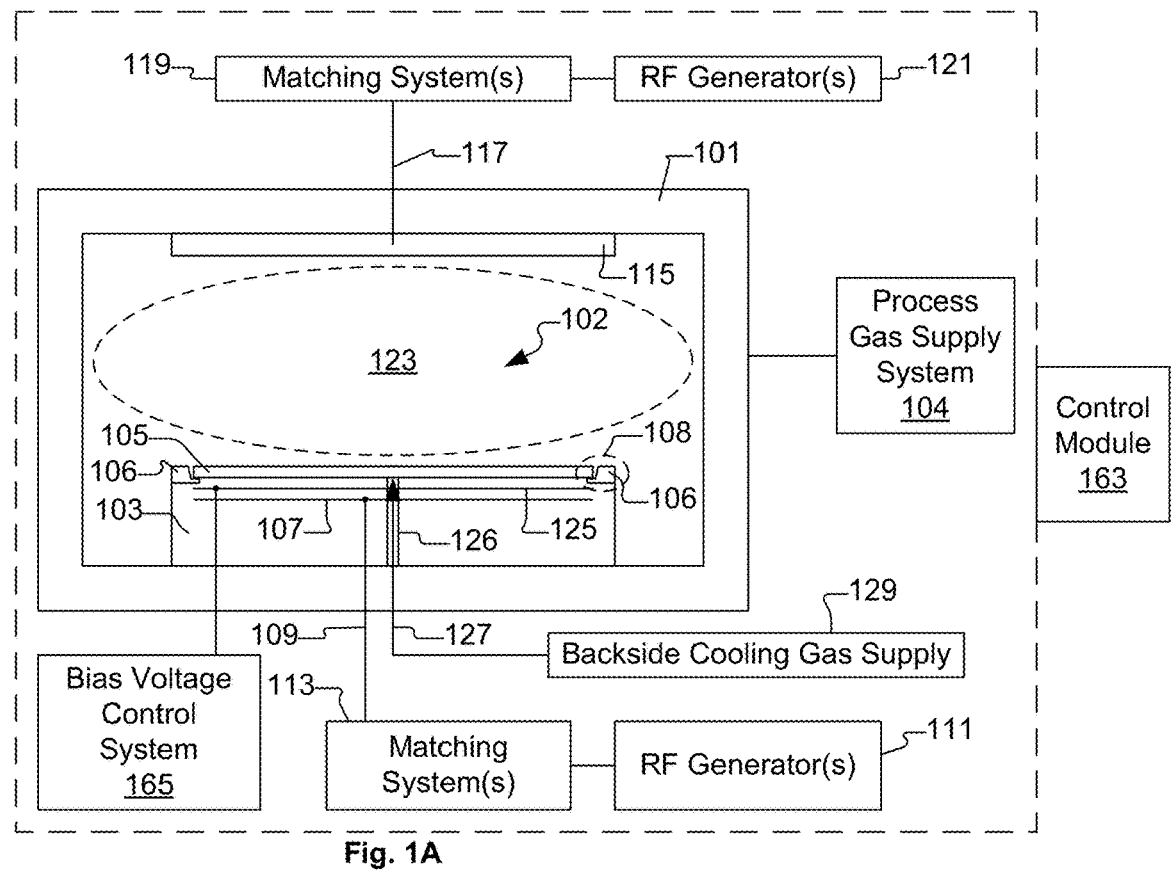
FIG. 1A shows an example vertical cross-section diagram of a CCP processing chamber, in accordance with some embodiments.

FIG. 1A shows an example vertical cross-section diagram of a CCP processing chamber 101, in accordance with some embodiments. The CCP processing chamber 101 includes a plasma processing region 102 within which a plasma 123 is generated in exposure to a wafer 105 to affect a change to the wafer 105 in a controlled manner. In various fabrication processes, the change to the wafer 105 can be a change in material or surface condition on the wafer 105. For example, in various fabrication processes, the change to the wafer 105 can include one or more of etching of a material from the wafer 105, deposition of a material on the wafer 105, or modification of material present on the wafer 105. In some embodiments, the wafer 105 is a semiconductor wafer undergoing a fabrication procedure. However, it should be understood that in various embodiments, the wafer 105 can be essentially any type of substrate that is subjected to a plasma-based fabrication process. For example, in some embodiments, the wafer 105 as referred to herein can be a substrate formed of silicon, sapphire, GaN, GaAs or SiC, or other substrate materials, and can include glass panels/substrates, metal foils, metal sheets, polymer materials, or the like. Also, in various embodiments, the wafer 105 as referred to herein may vary in form, shape, and/or size. For example, in some embodiments, the wafer 105 referred to herein may correspond to a circular-shaped semiconductor wafer on which integrated circuit devices are manufactured. In various embodiments, the circular-shaped semiconductor wafer can have a diameter of 200 mm (millimeters), 300 mm, 450 mm, or of another size. Also, in some embodiments, the wafer 105 referred to herein may correspond to a non-circular substrate, such as a rectangular substrate for a flat panel display, or the like, among other shapes.

The CCP processing chamber 101 is connected to a process gas supply system 104, such that one or more process gas(es) can be supplied in a controlled manner to the plasma processing region 102. It should be understood that the process gas supply system 104 includes one or more process gas sources and an arrangement of valves and mass flow controllers to enable provision of the one or more process gas(es) to the plasma processing region 102 with a controlled flow rate and with a controlled flow time. In various embodiments, the CCP processing chamber 101 operates by having the process gas supply system 104 deliver one or more process gases into the plasma processing region 102, and by applying RF power to the one or more process gases to transform the one or more process gases into the plasma 123 in exposure to the wafer 105, in order to cause a change in material or surface condition on the wafer 105.

The CCP processing chamber 101 includes a wafer support structure 103 upon which the wafer 105 is positioned and supported during processing operations. In some embodiments, the wafer support structure 103 is an electrostatic chuck (ESC) that includes one or more clamp electrodes (not shown) to which a clamping voltage is applied to generate an electrostatic field that attracts the wafer 105 toward the wafer support structure 103 and that holds the wafer 105 securely on the wafer support structure 103 during performance of the plasma-based fabrication process on the wafer 105. In some embodiments, an electrode 107 is disposed within the wafer support structure 103 to provide for transmission of RF power from the electrode 107 through the plasma processing region 102 to generate the plasma 123 and/or control ion energy. The electrode 107 is connected to receive RF power through an RF feed structure 109, which is connected to one or more RF power generator(s) 111 by way of one or more impedance matching system(s) 113. The impedance matching system(s) 113 include an arrangement of capacitors and inductors configured to ensure that an impedance seen by the RF power generator(s) 111 at the input of the impedance matching system(s) 113 is sufficiently close to an output impedance for which the RF power generator(s) 111 is designed to operate (usually 50 Ohm), so that RF power generated and transmitted by the RF power generator(s) 111 will be transmitted into the plasma processing region 102 in an efficient manner, e.g., without unacceptable or undesirable reflection.

Also, in some embodiments, the CCP processing chamber 101 can include an upper electrode 115. In various embodiments, the upper electrode 115 can provide either an electrical ground electrode or can be used to transmit RF power into the plasma processing region 102. For example, in some embodiments, the upper electrode 115 is connected to a reference ground potential, such that the upper electrode 115 provides a return path for RF signals transmitted into the plasma processing region 102 from the electrode 107. Alternatively, in some embodiments, the upper electrode 115 is connected to receive RF power through an RF feed structure 117, which is connected to one or more RF power generator(s) 121 by way of one or more impedance matching system(s) 119. The impedance matching system(s) 119 include an arrangement of capacitors and inductors configured to ensure that an impedance seen by the RF power generator(s) 121 at the input of the impedance matching system(s) 119 is sufficiently close to an output impedance for which the RF powers generator(s) 121 is designed to operate (usually 50 Ohm), so that RF power generated and transmitted by the RF power generator(s) 121 will be transmitted into the plasma processing region 102 in an efficient manner, e.g., without unacceptable or undesirable reflection.

Also, in some embodiments, a bias voltage control system 165 is connected to the wafer support structure 103 within the CCP processing chamber 101. In some embodiments, the bias voltage control system 165 is connected to one or more bias voltage electrodes 125 disposed within the wafer support structure 103 to control a bias voltage present at the location of the wafer 105. The bias voltage can be controlled to attract charged constituents of the plasma 123 toward the wafer 105 and thereby control energy and directionality of the charged constituents of the plasma 123. For example, the bias voltage control system 165 can be operated to accelerate ions in the plasma 123 toward the wafer 105 to perform an anisotropic etch on the wafer 105.

Also, in some embodiments, a backside cooling gas supply 129 is connected to supply a backside cooling gas through a wafer backside cooling gas supply channel 126 formed within the wafer support structure 103 to a region between the wafer support structure 103 and the wafer 105, as indicated by the arrow 127. In some embodiments, a top surface of the wafer support structure 103 is configured to have a distribution of minimum contact area (MCA) support structures 209 on which the wafer 105 is supported (see FIG. 2B). Each of the MCA support structures 209 is configured as a mesa-type structure that supports the wafer 105 at an elevated position relative to the top surface of the wafer support structure 103. In this manner, when the wafer 105 is present on the wafer support structure 103, a gas flow region is formed between the wafer 105 and the top surface of the wafer support structure 103 and between the MCA support structures 209. Therefore, when the backside cooling gas is supplied to a location near a center of the top surface of the wafer support structure 103, the backside cooling gas flows between the MCA support structures 209, through the gas flow region formed between the wafer 105 and the top surface of the wafer support structure 103, toward a periphery of the wafer support structure 103. The backside cooling gas provides for thermal conduction (heat transfer) between the wafer support structure 103 and the wafer 105 during performance of the plasma-based fabrication process on the wafer 105. In some embodiments, the backside cooling gas is helium (He). However, in other embodiments, the backside cooling gas can be a gas or mixture of gases other than helium, so long as the backside cooling gas is chemically, thermally, and reactively compatible with the plasma-based fabrication process performed on the wafer 105.

Also, an edge ring structure 106 is configured to circumscribe the wafer support structure 103 and the wafer 105. The edge ring structure 106 is configured to facilitate extension of the plasma sheath radially outward beyond the peripheral edge of the wafer 105 to provide improvement in process results near the periphery of the wafer 105. In various embodiments, the edge ring structure 103 is formed of a conductive material, such as silicon, boron doped single crystalline silicon, alumina, silicon carbide, or a silicon carbide layer on top of an alumina layer, or an alloy of silicon, or a combination thereof, among other materials. It should be understood that the edge ring structure 106 is formed as an annular-shaped structure, e.g., as a ring-shaped structure (see FIG. 2B).

Figure 1B:
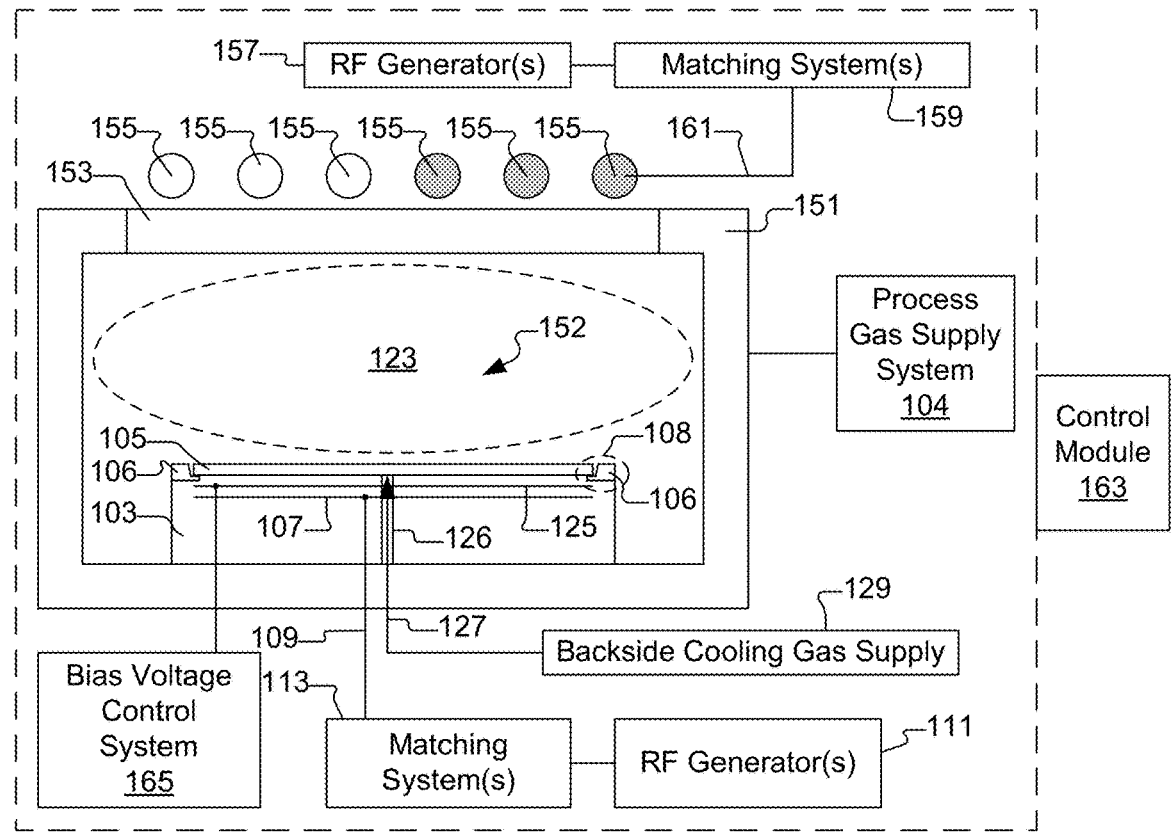
FIG. 1B shows an example vertical cross-section diagram of an ICP processing chamber, in accordance with some embodiments.

FIG. 1B shows an example vertical cross-section diagram of an ICP processing chamber 151, in accordance with some embodiments. The ICP processing chamber can also be referred to as a transformer coupled plasma (TCP) processing chamber. For ease of discussion herein, ICP processing chamber will be used to refer to both ICP and TCP processing chambers. The ICP processing chamber 151 includes a plasma processing region 152 in which the plasma 123 is generated in exposure to the wafer 105 to affect a change to the wafer 105 in a controlled manner. In various fabrication processes, the change to the wafer 105 can be a change in material or surface condition on the wafer 105. For example, in various fabrication processes, the change to the wafer 105 can include one or more of etching of a material from the wafer 105, deposition of a material on the wafer 105, or modification of material present on the wafer 105. It should be understood that the ICP processing chamber 151 can be any type of ICP processing chamber in which RF power is transmitted from a coil 155 disposed outside the ICP processing chamber 151 to a process gas within the ICP processing chamber 151 to generate the plasma 123 within the plasma processing region 152. An upper window structure 153 is provided to allow for transmission of RF power from the coil 155 through the upper window structure 153 and into the plasma processing region 152 of the ICP processing chamber 151.

The ICP processing chamber 151 is connected to the process gas supply system 104, such that one or more process gas(es) can be supplied in a controlled manner to the plasma processing region 152. The ICP processing chamber 151 operates by having the process gas supply system 104 flow one or more process gases into the plasma processing region 152, and by applying RF power from the coil 155 to the one or more process gases to transform the one or more process gases into the plasma 123 in exposure to the wafer 105, in order to cause a change in material or surface condition on the wafer 105. The coil 155 is disposed above the upper window structure 153. In the example of FIG. 1B, the coil 155 is formed as a radial coil assembly, with the shaded parts of the coil 155 turning into the page of the drawing and with the unshaded parts of the coil 155 turning out of the page of the drawing. It should be understood, however, that in other embodiments the coil 155 can have essentially any configuration that is suitable for transmitting RF power through the upper window structure 153 and into the plasma processing region 152. In various embodiments, the coil 155 can have any number of turns and any cross-section size and shape (circular, oval, rectangular, trapezoidal, etc.) as appropriate to provide the desired transmission of RF power through the upper window structure 153 into the plasma processing region 152.

The coil 155 is connected through an RF power supply structure 161 to one or more RF power generator(s) 157 by way of one or more impedance matching system(s) 159. The impedance matching system(s) 159 includes an arrangement of capacitors and/or inductors configured to ensure that an impedance seen by the RF power generator(s) 157 at the input of the impedance matching system(s) 159 is sufficiently close to an output impedance for which the RF power generator(s) 157 is designed to operate (usually 50 Ohms), so that RF power supplied to the coil 155 by the RF power generator(s) 157 will be transmitted into the plasma processing region 152 in an efficient manner, i.e., without unacceptable or undesirable reflection. Also, in some embodiments, the ICP processing chamber 151 can include the electrode 107, the RF feed structure 109, the impedance matching system(s) 113, and the RF power generator(s) 111, as previously described with regard to FIG. 1A.

Also, in some embodiments, the ICP processing chamber 151 can include the bias voltage control system 165 connected to one or more bias voltage electrodes 125 disposed with the wafer support structure 103, as described with regard to FIG. 1A. Also, in some embodiments, the ICP processing chamber 151 can include the backside cooling gas supply 129 connected to supply the backside cooling gas through the wafer backside cooling gas supply channel 126 to the region between the wafer support structure 103 and the wafer 105, as indicated by the arrow 127, as described with regard to FIG. 1A. Also, in some embodiments, the ICP processing chamber 151 can include the edge ring structure 106 configured to circumscribe the wafer support structure 103 and the wafer 105, as described with regard to FIG. 1A.

A control module 163 is configured and connected to provide for control of plasma process operations performed in the CCP processing chamber 101 and in the ICP processing chamber 151. In some embodiments, the control module 163 is implemented as a combination of computer hardware and software. The control module 163 can be configured and connected to provide for control of essentially any system or component associated with the CCP processing chamber 101 and/or the ICP processing chamber 151. For example, the control module 163 can be configured and connected to control the process gas supply system 104, the RF generator(s) 111, the impedance matching system(s) 113, the RF generator(s) 121, the impedance matching system(s) 119, the bias voltage control system 165, the RF generator(s) 157, the impedance matching system(s) 159, the backside cooling gas supply 129, and/or any other system or component.

Also, the control module 163 can be connected and configured to receive signals from various components, sensors, and monitoring devices associated with the CCP processing chamber 101 and the ICP processing chamber 151. For example, the control module 163 can be connected and configured to receive electrical measurement signals, e.g., voltage and/or current, and RF measurement signals from one or more of the wafer support structure 103, the RF feed structure 109, the RF feed structure 117, the RF feed structure 161, the electrical connection 127, and from any other structure or component within the CCP processing chamber 101 and the ICP processing chamber 151. And, the control module 163 can be connected and configured to receive temperature and pressure measurement signals from within the plasma processing regions 102 and 152 of the CCP processing chamber 101 and the ICP processing chamber 151, respectively. Also, the control module 163 can be configured and connected to receive, process, and respond to an optically measured signal within the CCP processing chamber 101 and the ICP processing chamber 151. And, the control module 163 can be configured and connected to receive, process, and respond to gas flow measurements associated with the process gas supply system 104 and the backside cooling gas supply 129.

It should be understood that the control module 163 can be connected and configured to control essentially any active device, i.e., controllable device, associated with operation of the CCP processing chamber 101 and the ICP processing chamber 151. And, it should be understood that the control module 163 can be connected and configured to monitor essentially any physical and/or electrical state, condition, and/or parameter at essentially any location within the CCP processing chamber 101 and the ICP processing chamber 151. The control module 163 can also be configured to direct operation of various components in a synchronous and scheduled manner to perform a prescribed plasma processing operation on the wafer 105. For example, the control module 163 can be configured to operate the CCP processing chamber 101 and the ICP processing chamber 151 by executing process input and control instructions/programs. The process input and control instructions/programs may include process recipes having time-dependent directions for parameters such as power levels, timing parameters, process gases, backside cooling gas, mechanical movement of the wafer 105, etc., as needed to obtain a desired process result on the wafer 105.

Figure 2A:
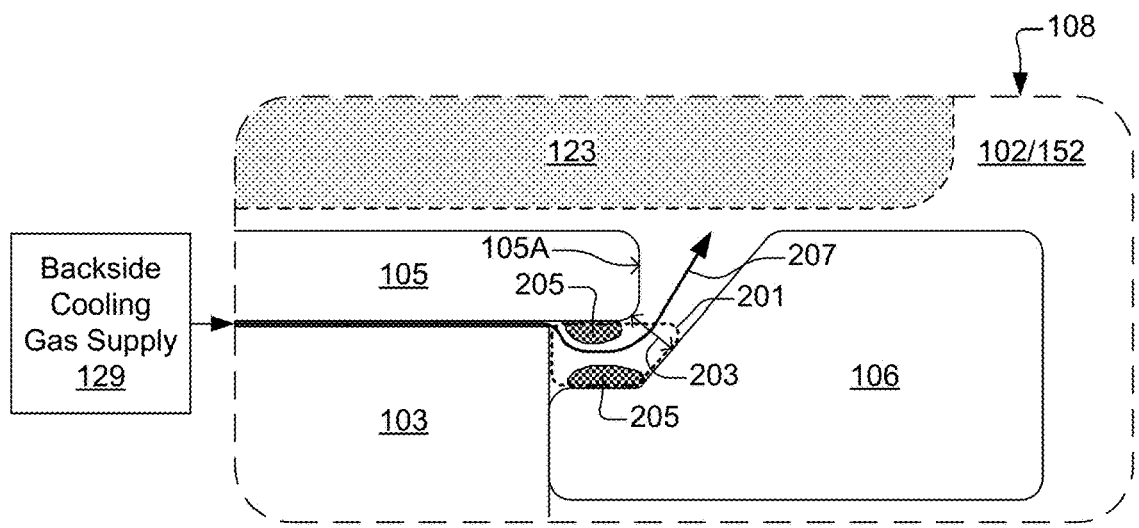
FIG. 2A shows a close-up view of the vertical cross-section through a region that includes a peripheral edge of the wafer, in accordance with some embodiments.

FIG. 2A shows a close-up view of the vertical cross-section through a region 108, as referenced in FIGS. 1A and 1B, that includes a peripheral edge 105A of the wafer 105, in accordance with some embodiments. In the example configuration of FIG. 2A, the wafer 105 extends beyond a periphery of the top surface of the wafer support structure 103. The edge ring structure 106 is formed to circumscribe both the wafer support structure 103 and the wafer 105. The edge ring structure 106 is formed to have a recess in its upper, interior region so as to extend below an outer peripheral portion of the wafer 105 that extends beyond the periphery of the top surface of the wafer support structure 103. The edge ring structure 106 is sized and positioned such that a lower peripheral open region 201 exists between a peripheral portion of a bottom surface of the wafer 105 and the edge ring structure 106. In some embodiments, a distance 203 measured across the lower peripheral open region 201 between the wafer 105 and the edge ring structure 106 is less than about 0.5 millimeter (mm). In some embodiments, the distance 203 measured across the lower peripheral open region 201 between the wafer 105 and the edge ring structure 106 is about 0.3 mm. The distance 203 refers to the shortest distance between the wafer 105 and the edge ring structure 106. It should be understood, that in various embodiments, the distance 203 can be measured between respective locations on the wafer 105 and the edge ring structure 106 that are different from what is depicted by the example arrow 203 of FIG. 2A. Also, in various embodiments, the distance 203 can be measured in a direction that is different from what is depicted by the example arrow 203 of FIG. 2A. Also, in some embodiments, the distance 203 can be greater than about 0.5 mm.

Figure 2B:
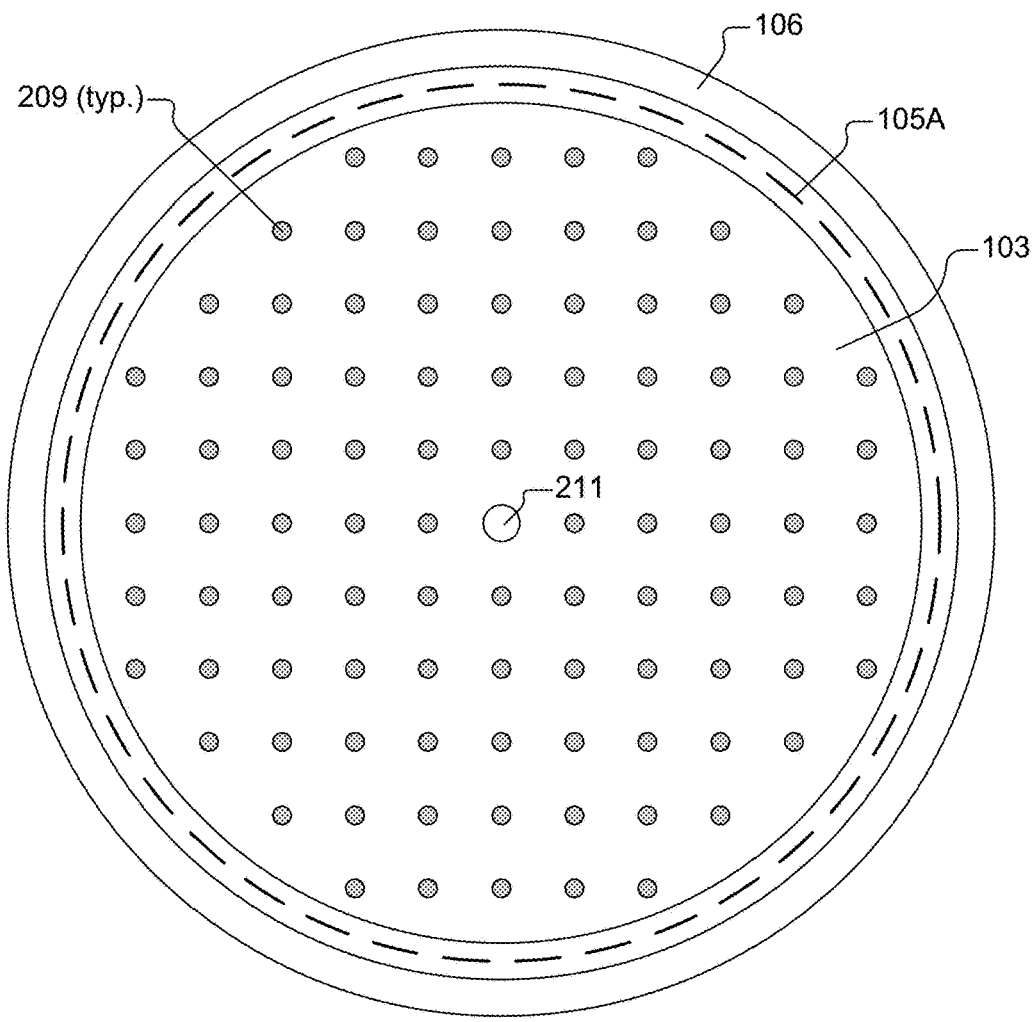
FIG. 2B shows a top view of the wafer support structure, with the edge ring structure positioned to circumscribe the wafer support structure, in accordance with some embodiments.

FIG. 2B shows a top view of the wafer support structure 103, with the edge ring structure 106 positioned to circumscribe the wafer support structure 103, in accordance with some embodiments. The peripheral edge 105A of the wafer 105 is also shown in FIG. 2B. The wafer 105 is positioned to sit on the MCA support structures 209 distributed across the top surface of the wafer support structure 103. The backside cooling gas, e.g., helium, is supplied from the backside cooling gas supply 129 to one or more gas delivery ports 211 positioned near the center of the top surface of the wafer support structure 103. FIG. 2A shows an arrow 207 that represents flow of the backside cooling gas from the one or more gas delivery ports 211, through the region between the top surface of the wafer support structure 103 and the bottom surface of the wafer 105 (between the MCA support structures 209), through the lower peripheral open region 201, and into the plasma processing region 102/152 in which the plasma 123 is generated.

FIG. 2A also shows accumulation of byproduct material(s) 205 in areas that are shaded from the plasma 123, such as in the lower peripheral open region 201 between the peripheral portion of the bottom surface of the wafer 105 and the edge ring structure 106. The byproduct material(s) 205 can be prone to deposit in the areas that are shaded from the plasma 123 during performance of the plasma-based fabrication process on the wafer 105. Accumulation of byproduct material(s) 205, such as etch residues, on and around various components within the plasma processing chamber 101/151 (i.e., the CCP processing chamber 101 and/or the ICP processing chamber 151) is a fundamental wafer 105 fabrication productivity concern. And, accumulation of byproduct material(s) 205 in the areas that are shaded from the plasma 123, especially in the lower peripheral open region 201 between the wafer 105 and the edge ring structure 106, is quite troublesome and a major wafer 105 fabrication productivity concern.

During plasma processing of the wafer 105, ion and neutral species from the plasma 123 can reach the edge ring structure 106 and cause deposition of polymer and/or salt byproduct material(s) 205 on portions of the edge ring structure 106 that extend around the peripheral edge 105A of the wafer 105 and below the outer peripheral portion of the wafer 105 that extends beyond the periphery of the top surface of the wafer support structure 103. Also, during plasma processing of the wafer 105, electrons from the plasma 123 can travel into the region between the wafer 105 and the edge ring structure 106, i.e., into the lower peripheral open region 201, and these electrons can have high enough energy to cause dissociation of the process gas to create radical species locally within the region between the wafer 105 and the edge ring structure 106, that in turn cause deposition of polymer and/or salt byproduct material(s) 205 on portions of the edge ring structure 106 that extend around the peripheral edge 105A of the wafer 105 and below the wafer 105. The accumulation of residual films and/or particles of byproduct material(s) 205, especially around the wafer support structure 103 area, is a serious productivity concern because such accumulation of byproduct material(s) 205 can contribute to a number of adverse conditions, such as plasma 123 arcing, wafer 105 arcing, particle contamination on the wafer 105, particle contamination on the wafer support structure 103, and poor wafer 105 clamping to the wafer support structure 103, among others. Problems associated with accumulation of byproduct material(s) 205 within the plasma processing chamber 101/151 can be worse when the process gas chemistry includes significant quantities of nitrogen (N) and hydrogen (H), which tend to cause accumulation of byproduct material(s) 205 that include ammonium salts in combination with more typical hydrofluorocarbon polymers.

During performance of a single processing cycle on the wafer 105, i.e., over the full course of a plasma-based fabrication process on the wafer 105 as performed between entry of the wafer 105 into the plasma processing chamber 101/151 and exit of the wafer 105 from the plasma processing chamber 101/151, it is possible that enough polymer and/or salt byproduct material(s) 205 can accumulate within the lower peripheral open region 201 to cause electrical arcing between the wafer 105 and the edge ring structure 106. Deposition and accumulation of the polymer and/or salt byproduct material(s) 205 on the edge ring structure 106 changes the electrical properties of the edge ring structure 106 surface in a way that can promote electrical arcing between the wafer 105 and the edge ring structure 106. For example, dendrites or sharp edges of the byproduct material(s) 205 can concentrate the electrical field to promote electrical arcing between the wafer 105 and the edge ring structure 106. Also, the byproduct material(s) 205 can act as an electrical insulator which can lead to a concentration of the electric field and buildup of sufficient electrical charge in the region of the byproduct material(s) 205 to promote electrical arcing between the wafer 105 and the edge ring structure 106. Moreover, electrical arcing between the wafer 105 and the edge ring structure 106 due to accumulation of byproduct material(s) 205 in the lower peripheral open region 201 becomes more of a problem as the duration of the plasma-based fabrication process increases, because there is more time for the byproduct material(s) 205 to accumulate. For example, deep high-aspect ratio feature etching can require a longer etching process, which can lead to accumulation of enough byproduct material(s) 205 of the edge ring structure 106 and/or wafer 105 bottom surface within the lower peripheral open region 201 to cause electrical arcing between the wafer 105 and the edge ring structure 106. To avoid damaging the wafer 105, it is necessary to prevent such electrical arcing between the wafer 105 and the edge ring structure 106. Therefore, it is of interest and importance to manage accumulation of byproduct material(s) 205 within the lower peripheral open region 201 as the duration of plasma-based fabrication processes on the wafer 105 increases. And, such management of byproduct material(s) 205 accumulation is considered a significant productivity challenge in wafer 105 manufacturing.

Figure 2C:
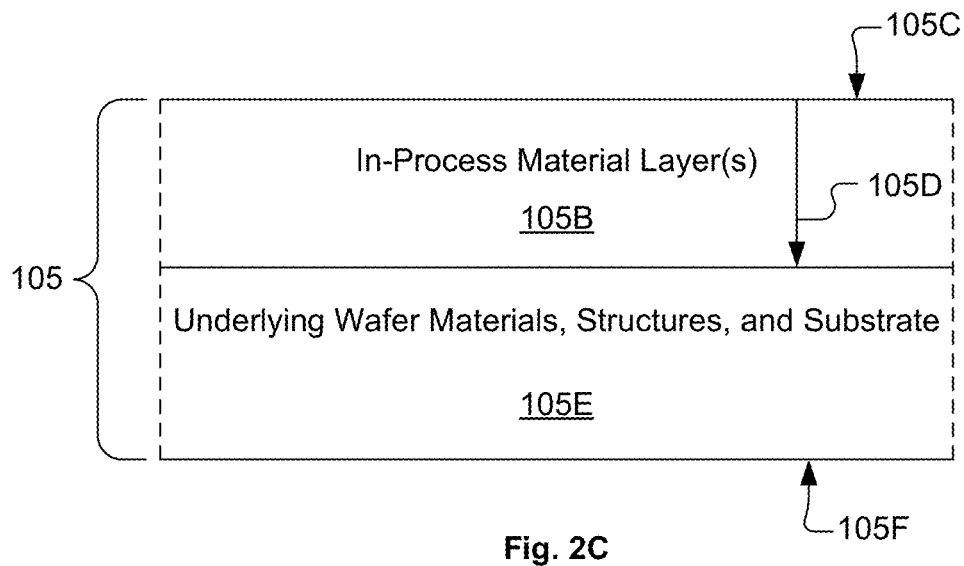
FIG. 2C shows a vertical cross-section through a section of the wafer, in accordance with some embodiments.

FIG. 2C shows a vertical cross-section through a section of the wafer 105, in accordance with some embodiments. The wafer 105 includes one or more in-process material layer(s) 105B that extend from a top surface 105C of the wafer 105 down to some depth 105D within the wafer 105. Below the depth 105D, the wafer 105 includes an underlying section 105E that extends to a bottom surface 105F of the wafer 105. The underlying section 105E includes underlying wafer materials, structures, and a substrate. In various embodiments, the in-process material layer(s) 105B can include essentially any material or combination of materials through which holes and/or slits are to be etched using a plasma-based etching process. In some embodiments, the in-process material layer(s) 105B can include a stack of materials. For example, in the case of 3D NAND integrated circuit manufacturing, the in-process material layer(s) 105B can include an ONON stack (oxide/nitride stack) and/or an OPOP stack (oxide/polysilicon stack). The ONON stack is a vertical stack of alternating oxide film and nitride film. The OPOP stack is a vertical stack of alternating oxide film and polysilicon film. Depending on the memory density of the 3D NAND integrated circuit, each of the ONON stack and the OPOP stack can include up to 60 or more film layers. The 3D NAND integrated circuit also includes channels that are formed to extend vertically through the entire ONON stack or OPOP stack. The channels are formed in part by etching channel holes down through the ONON stack or OPOP stack. Currently, channel hole etch in 3D NAND integrated circuit fabrication is considered one of the most technologically challenging dry etch processes. At full depth, the channel holes can have aspect ratios (i.e., the ratio of hole depth to hole width (hole depth:hole width)) of up to 40:1 or more. As the ONON and/or OPOP stacks are formed to have greater overall vertical thickness, the required etch depth for formation of channel holes through the ONON and/or OPOP stacks becomes greater, and correspondingly, the overall duration of the plasma-based etching process increases.

In some 3D NAND integrated circuit manufacturing processes, a fluorine-based plasma etching process is used to form channel holes of very high aspect ratio through ONON and/or OPOP stacks. For example, in some embodiments, the fluorine-based plasma etching process can use a process gas that includes one or more of trifluoroiodomethane ($CF_3I$), trifluoroamine ($NF_3$), sulfur hexafluoride ($SF_6$), octafluorocyclobutane (c-$C_4F_8$), 1,3-hexafluoro-1,3-butadiene ($C_4F_6$), tetrafluoromethane ($CF_4$), difluoromethane ($CH_2F_2$), fluoromethane ($CH_3F$), and perfluoropropane ($C_3F_8$), among others. However, in other 3D NAND integrated circuit manufacturing processes, a plasma etching process to form channel holes can use a process gas that includes one or more of hydrogen ($H_2$), nitrogen ($N_2$), xenon (Xe), hydrogen bromide (HBr), carbonyl sulfide (COS), methane ($CH_4$), oxygen ($O_2$), krypton (Kr), among others. Due to the nature of the etching films and process gas (etchant) used in the plasma-based etching process to form the channel holes down through the ONON stack or OPOP stack, the interior walls and component surfaces with the plasma processing chamber 101/151 can accumulate a substantial amount of byproduct material(s) 205 in a form of a film that includes fluorocarbon polymer material and/or salt material, such as an ammonium salt Fluorocarbon polymer and/or salt byproduct material(s) 205 can be etch resistant and difficult to clean. For example, ammonium fluoride ($NH_4F$) and ammonium hexafluorosilicate $((NH_3)_2SiF_6)$ are some of the most difficult salt byproduct materials 205 to clean. Accumulation of the byproduct material 205 ammonium fluoride ($NH_4F$) has been observed around the wafer support structure 103, on the edge ring structure 106, and on the outer peripheral region of the bottom surface of the wafer 105 that extends horizontally beyond the top surface of the wafer support structure 103, such as shown by the byproduct material(s) 205 in FIG. 2A. Also, it has been observed that accumulation of the byproduct material 205 ammonium fluoride ($NH_4F$) is predominant and common on chamber components that are subject to lower temperature, e.g., less than 80° Celsius (C), during the plasma etching process. Surfaces of chamber components that are subject to higher temperature, e.g., greater than 100° C., during the plasma etching process typically do not have significant accumulation of the byproduct material 205 ammonium fluoride ($NH_4F$). This is due to the rapid sublimation of ammonium fluoride ($NH_4F$) and other ammonium salts at higher temperature, e.g., greater than 100° C. Also, it should be understood that in addition to (or instead of) ammonium fluoride ($NH_4F$), the byproduct material(s) 205 can include other salts such as one or more of ammonium iodide ($NH_4I$), ammonium hexafluorosilicate $((NH_4)_2SiF_6)$, ammonium bromide ($NH_4Br$), ammonium chloride ($NH_4Cl$), and ammonium bifluoride ($NH_4HF_2$) (bifluoride is FHF—) (likely present under conditions that produce $NH_4F$), among others.

Conventionally, accumulation of byproduct material(s) 205 within the plasma processing chamber 101/151 is managed by performing a dry cleaning operation in the plasma processing chamber 101/151 between processing of wafers 105, i.e., when the wafer 105 is not present within the plasma processing chamber 101/151. However, prior to the embodiments disclosed herein, there has been no way to prevent and/or manage accumulation of byproduct material(s) 205 in areas that are shaded from the plasma 123 (such as in the lower peripheral open region 201 between the wafer 105 and the edge ring structure 106) during performance of the plasma-based fabrication process on the wafer 105, and especially during performance of a dielectric film etching process on the wafer 105. Also, it should be appreciated that it is too inefficient to interrupt performance of the plasma-based fabrication process on the wafer 105 in order to remove the wafer 105 from the plasma processing chamber 101/151 and clean the plasma processing chamber 101/151, and then place the wafer 105 back into the plasma processing chamber 101/151 to complete the plasma-based fabrication process. Moreover, there is some increased process risk associated with removing the wafer 105 from the plasma processing chamber 101/151 prior to completion of the full plasma-based fabrication process on the wafer 105. Additionally, prior to the embodiments disclosed herein, there has been no way to actively clean dielectric etch polymer (organic) and/or salt (inorganic) byproduct material(s) 205 during performance of the dielectric etch process on the wafer 105. Although some methods exist for cleaning the dielectric etch polymer (organic) and/or salt (inorganic) byproduct material(s) 205 after the wafer 105 is removed from the plasma processing chamber 101/151, e.g., waferless auto cleaning (WAC), these methods cannot be applied during performance of the dielectric etching process on the wafer 105, i.e., with the wafer 105 present inside the plasma processing chamber 101/151, without harming the wafer 105.

Various embodiments are disclosed herein for methods and associated systems for management of accumulation of byproduct material(s) 205 within the lower peripheral open region 201 between the wafer 105 and the edge ring structure 106. It should be understood that the management of accumulation of byproduct material(s) 205 within the lower peripheral open region 201 is conducted during performance of a plasma-based fabrication process, e.g., etching process, on the wafer 105. Therefore, with the management of accumulation of byproduct material(s) 205 within the lower peripheral open region 201, as afforded by the methods and systems disclosed herein, it is possible to perform longer duration plasma-based fabrication processes on the wafer 105, without exposing the wafer 105 to the danger of electrical arcing between the wafer 105 and the edge ring structure 106. It should also be understood that while complete removal of byproduct material(s) 205 from within the lower peripheral open region 201 is certainly beneficial and acceptable, such complete removal of byproduct material(s) 205 from within the lower peripheral open region 201 during performance of a plasma-based fabrication process on the wafer 105 is not necessary to achieve the objective of the methods and systems disclosed herein. More specifically, the methods and systems disclosed herein are defined for "management" of accumulation of byproduct material(s) 205 within the lower peripheral open region 201, so that whatever amount of byproduct material(s) 205 does accumulate within the lower peripheral open region 201 will not be sufficient enough to cause problems such as electrical arcing and/or particle contamination on the wafer 105 or wafer support structure 103, and thereby enable performance of longer duration plasma-based fabrication processes on the wafer 105.

Generally speaking, methods and systems are disclosed herein for supplying a byproduct volatizing gas to locations of interest where problematic accumulation of byproduct material(s) 205 can occur during performance of a plasma-based fabrication process, e.g., etching process, on the wafer 105. It should be understood and appreciated that the byproduct volatizing gas is supplied to locations of interest during performance of a plasma-based fabrication process, e.g., etching process, on the wafer 105. The supply of the byproduct volatizing gas to locations of interest may be particularly useful in low-temperature processing regimes, e.g., wafer support structure 103 temperature less than 0° C., (also referred to as cryogenic processing regimes) in which salt byproduct material(s) 205 accumulation around the wafer support structure 103 is a significant wafer 105 fabrication productivity concern. In some embodiments, in the low-temperature processing regimes, the wafer 105 temperature can be greater than the temperature of the wafer support structure 103. For example, even if the wafer support structure 103 temperature is less than 0° C., the wafer 105 temperature can be higher than 0° C., e.g., up to or greater than 20° C. In various embodiments, the byproduct volatizing gas includes one or more of oxygen ($O_2$), carbon dioxide ($CO_2$), and carbon monoxide (CO). Use of oxygen ($O_2$) and/or carbon dioxide ($CO_2$) and/or carbon monoxide (CO) in exposure to a plasma has been shown to be effective in removing polymer and salt byproduct material(s) 205 from surfaces within plasma processing chamber 101/151 during dry cleaning of the plasma processing chamber 101/151 between wafer 105 processing cycles, i.e., without the wafer 105 present in the plasma processing chamber 101/151. In some embodiments, an effective byproduct volatizing gas for removing polymer and salt byproduct material(s) 205 is a combination of oxygen ($O_2$) and one or both of carbon dioxide ($CO_2$) and carbon monoxide (CO). The oxygen ($O_2$) component of the byproduct volatizing gas is particularly effective in removing polymer byproduct material(s) 205. The carbon dioxide ($CO_2$) and carbon monoxide (CO) components of the byproduct volatizing gas are particularly effective in removing salt byproduct material(s) 205. In some embodiments, the byproduct volatizing gas includes equal parts of oxygen ($O_2$) and carbon dioxide ($CO_2$). In some embodiments, the byproduct volatizing gas includes equal parts of oxygen ($O_2$) and carbon monoxide (CO). Also, in some embodiments, the relative amounts of oxygen ($O_2$) and carbon dioxide ($CO_2$) and/or carbon monoxide (CO) in the byproduct volatizing gas can be adjusted. Also, in some embodiments, the byproduct volatizing gas can include other gas(es) either in lieu of or in place of oxygen ($O_2$) and/or carbon dioxide ($CO_2$) and/or carbon monoxide (CO).

During performance of a plasma-based fabrication process on the wafer 105, the byproduct volatizing gas is supplied to the locations of interest where problematic accumulation of byproduct material(s) 205 occurs. And, the byproduct volatizing gas undergoes dissociation in exposure to the plasma 123 to create reactive species of the byproduct volatizing gas that react with the byproduct material(s) 205 to form volatile species/compounds that are carried away with gas flow to the exhaust system of the plasma processing chamber 101/151, thereby providing for removal of some of the byproduct material(s) 205. For example, with use of oxygen ($O_2$) and carbon dioxide ($CO_2$) as the byproduct volatizing gas, the oxygen ($O_2$) dissociates in exposure to the plasma 123 to form O radicals, and the carbon dioxide ($CO_2$) dissociates in exposure to the plasma 123 to form O radicals, C radicals, and CO molecules. The C radicals produced by dissociation of $CO_2$ may contribute to etching of ammonium salts. The O and C radicals are reactive species that may undergo chemical reaction with the byproduct material(s) 205 to form volatile species/compounds that are carried away with gas flow to the exhaust system of the plasma processing chamber 101/151.

Again, it should be understood that the byproduct volatizing gas is supplied to locations of interest (where problematic accumulation of byproduct material(s) 205 can occur) while the wafer 105 is present within the plasma processing chamber 101/151 and while the wafer 105 is undergoing a plasma-based fabrication process, e.g., etching process. In some embodiments, the byproduct volatizing gas is supplied to locations of interest constantly during performance of the plasma-based fabrication process on the wafer 105. In some embodiments, the byproduct volatizing gas is supplied directly to the lower peripheral open region 201 between the peripheral portion of the bottom surface of the wafer 105 and the edge ring structure 106.

In some embodiments, the byproduct volatizing gas is added to the backside cooling gas, e.g., helium, such that the byproduct volatizing gas will flow with the backside cooling gas from the one or more gas delivery ports 211, through the region between the top surface of the wafer support structure 103 and the bottom surface of the wafer 105 (between the MCA support structures 209), and into the lower peripheral open region 201 where the problematic accumulation of byproduct material(s) 205 occurs on the edge ring structure 106 and on the bottom peripheral surface of the wafer 105. This byproduct volatizing gas delivery technique provides a high density of reactive species of the byproduct volatizing gas, e.g., O and/or C radicals, to byproduct material(s) 205 present on surface areas in the lower peripheral open region 201 that are shaded from the plasma 123. By adding the byproduct volatizing gas in the flow of the backside cooling gas it is possible to provide a constant flow the byproduct volatizing gas to the lower peripheral open region 201 between the wafer 105 and the edge ring structure 106.

The addition of byproduct volatizing gas, e.g., oxygen ($O_2$) and/or carbon dioxide ($CO_2$) and/or carbon monoxide (CO), to the flow of the backside cooling gas, e.g., helium, can be done in a manner that does not significantly impact an ability of the backside cooling gas to assist with cooling of the wafer 105, i.e., to enable heat transfer from the wafer 105 to the wafer support structure 103. In various embodiments, a flow rate of the byproduct volatizing gas is a fraction of the flow rate of the backside cooling gas. For example, in some embodiments, the flow rate of the byproduct volatizing gas (e.g., combined flow rate of oxygen ($O_2$) and/or carbon dioxide ($CO_2$) and/or carbon monoxide (CO)) can be about 5 standard cubic centimeters per minute (sccm) and the flow rate of the backside cooling gas (e.g., flow rate of helium) can be about 15 sccm, such that the byproduct volatizing gas is about 25% of a total gas flow through the region between the top surface of the wafer support structure 103 and the bottom surface of the wafer 105 (between the MCA support structures 209) and into the lower peripheral open region 201. However, it should be understood that these flow rates for the byproduct volatizing gas and the backside cooling gas are provided by way of example, and are not limiting for all embodiments. In other embodiments, the respective flow rates for the byproduct volatizing gas and the backside cooling gas can be set as needed to both maintain adequate cooling of the wafer 105 and provide adequate removal/management of accumulated byproduct material(s) 205 within the lower peripheral open region 201.

Also, in some embodiments, the byproduct volatizing gas is supplied directly to the lower peripheral open region 201 from a byproduct volatizing gas delivery component that is not associated with supply of the backside cooling gas. In some embodiments, the byproduct volatizing gas delivery component is a gas supply ring configured to circumscribe the wafer support structure. In some embodiments, the byproduct volatizing gas delivery component includes gas flow channels formed within the wafer support structure 103.

Figure 3:
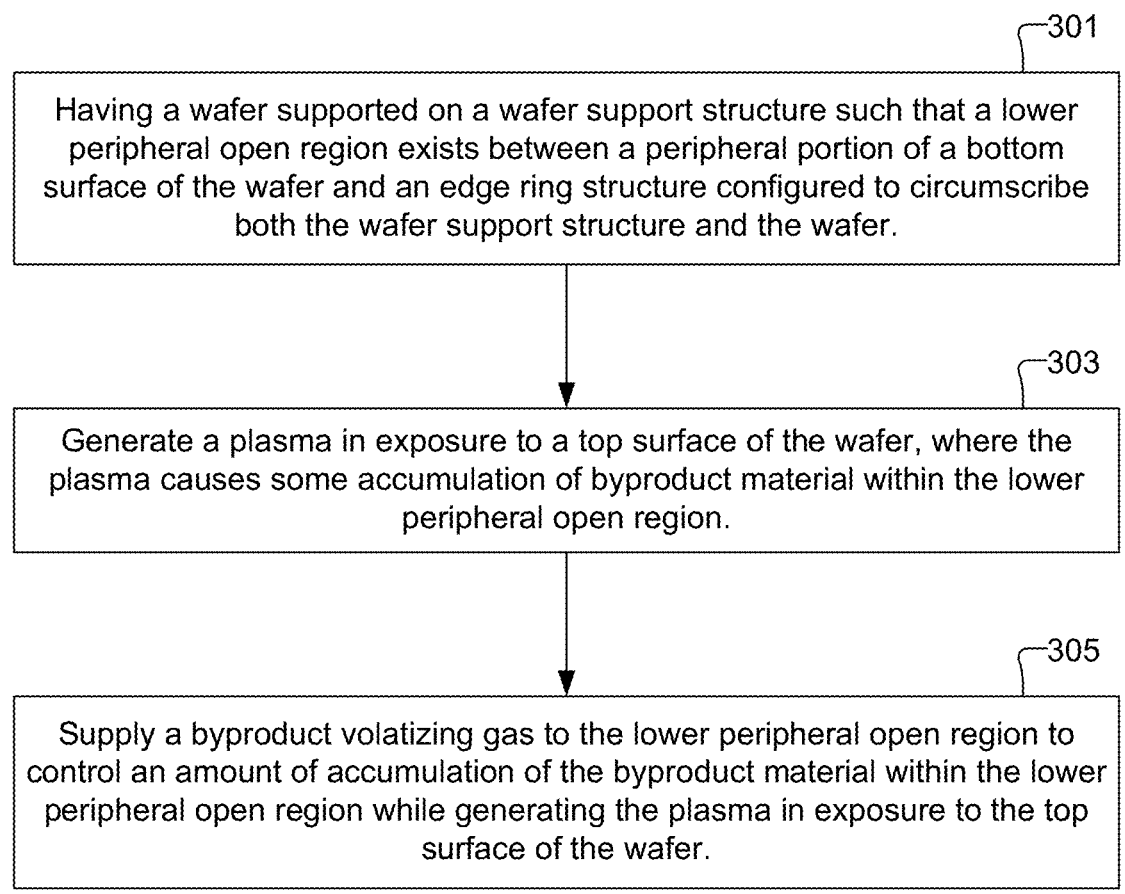
FIG. 3 shows a flowchart of a method for managing accumulation of byproduct material(s) during a plasma-based semiconductor wafer fabrication process, in accordance with some embodiments.

FIG. 3 shows a flowchart of a method for managing accumulation of byproduct material(s) 205 during a plasma-based semiconductor wafer fabrication process, in accordance with some embodiments. It should be understood that the method of FIG. 3 is performed while the wafer 105 is undergoing the plasma-based semiconductor wafer fabrication process. The method includes an operation 301 for having the wafer 105 supported on the wafer support structure 103, such that the lower peripheral open region 201 exists between the peripheral portion of the bottom surface of the wafer 105 and the edge ring structure 106, where the edge ring structure 106 is configured to circumscribe both the wafer support structure 103 and the wafer 105. In some embodiments, a distance measured across the lower peripheral open region 201 between the wafer 105 and the edge ring structure is less than about 0.5 mm when the wafer 105 is supported on the wafer support structure 103. The method also includes an operation 303 for generating the plasma 123 above the top surface of the wafer 105. In some embodiments, the plasma 123 is generated to cause etching of a dielectric material on the wafer 105. However, it should be understood that in various embodiments, the plasma 123 can be generated to cause either deposition of a material on the wafer 105, and/or etching of a material from the wafer 105, and/or modification of material present on the wafer 105. The plasma 123 causes accumulation of byproduct material(s) 205 within the lower peripheral open region 201.

The method also includes an operation 305 for supplying a byproduct volatizing gas to the lower peripheral open region 201 to control the accumulation of the byproduct material(s) 205 within the lower peripheral open region 201 during generation of the plasma 123. In some embodiments, upon completion of the plasma-based fabrication process on the wafer 105 and after removal of the wafer 105 from the plasma processing chamber 101/151, a cleaning process can be performed within the plasma processing chamber 101/151 to remove any remaining byproduct material(s) 205 from the edge ring structure 106.

In some embodiments, operation 303 for generating the plasma 123 in exposure to the top surface of the wafer 105 includes supplying a process gas to the plasma processing region 102/152 above the top surface of the wafer 105. In some embodiments, the process gas includes trifluoroiodomethane ($CF_3I$). In some embodiments, the process gas includes one or more of trifluoroamine ($NF_3$), hydrogen ($H_2$), nitrogen ($N_2$), xenon (Xe), hydrogen bromide (HBr), sulfur hexafluoride ($SF_6$), octafluorocyclobutane (c-$C_4F_8$), hexafluoro-1,3-butadiene ($C_4F_6$), tetrafluoromethane ($CF_4$), difluoromethane ($CH_2F_2$), carbonyl sulfide (COS), methane ($CH_4$), oxygen ($O_2$), krypton (Kr), fluoromethane ($CH_3F$), and perfluoropropane ($C_3F_8$). In some embodiments, the process gas is supplied at a non-zero flow rate within a range extending up to about 30 sccm. In some embodiments, the process gas is supplied at a flow rate within a range extending from about 5 sccm to about 15 sccm. Also, in some embodiments, the method includes controlling a pressure within the plasma processing region 102/152 above the top surface of the wafer 105 within a range extending from about 1 milliTorr to about 100 milliTorr, or within a range extending from about 10 milliTorr to about 50 milliTorr, or within a range extending from about 15 milliTorr to about 30 milliTorr. In some embodiments, the method includes controlling a temperature of the wafer 105 to be within a range extending up to about 0° C., or within a range extending from about −60° C. to about +80° C., or within a range extending from about −100° C. to about 0° C., or within a range extending from about −60° C. to about −20° C. It should be understood that generation of the plasma 123 in operation 303 using the above-mentioned example process gas(es) in combination with the above-mentioned example low temperatures of the wafer 105 can cause an increase in accumulation of polymer and salt byproduct material(s) 205, especially in the lower peripheral open region 201 between the wafer 105 and the edge ring structure 106. In some embodiments, the byproduct material(s) 205 include fluorocarbon polymer material and/or salt material. In some embodiments, the byproduct material(s) 205 include a salt that is one or more of ammonium fluoride ($NH_4F$), ammonium iodide ($NH_4I$), ammonium hexafluorosilicate (($NH_4)_2SiF_6$), ammonium bromide ($NH_4Br$), ammonium chloride ($NH_4Cl$), and ammonium bifluoride ($NH_4HF_2$) (bifluoride is FHF—) (likely present under conditions that produce $NH_4F$).

The byproduct volatizing gas supplied in the operation 305 is formulated to undergo dissociation when exposed to reactive species of the plasma 123 to create reactive species of the byproduct volatizing gas. The reactive species of the byproduct volatizing gas interact with the byproduct material(s) 205 to form volatile material that is carried away in an exhaust gas flow from the lower peripheral open region 201 and from the interior of the plasma processing chamber 101/151. In some embodiments, operation 305 is performed to supply the byproduct volatizing gas in a substantially constant manner during generation of the plasma 123 over the course of the performing the plasma-based fabrication process on the wafer 105. However, in some embodiments, operation 305 is performed to supply the byproduct volatizing gas in a pulsed and/or cyclic manner during generation of the plasma 123 over the course of the performing the plasma-based fabrication process on the wafer 105. In some embodiments, the byproduct volatizing gas includes one or more of oxygen ($O_2$), carbon dioxide ($CO_2$), and carbon monoxide (CO). In some embodiments, the byproduct volatizing gas includes substantially equal parts of oxygen ($O_2$) and carbon dioxide ($CO_2$). In some embodiments, the byproduct volatizing gas includes substantially equal parts of oxygen ($O_2$) and carbon monoxide (CO). In some embodiments, the byproduct material(s) 205 includes a polymer material, and the byproduct volatizing gas includes oxygen ($O_2$). In some embodiments, the byproduct material(s) 205 includes a salt, and the byproduct volatizing gas includes one or both of carbon dioxide ($CO_2$) and carbon monoxide (CO).

Figure 4:
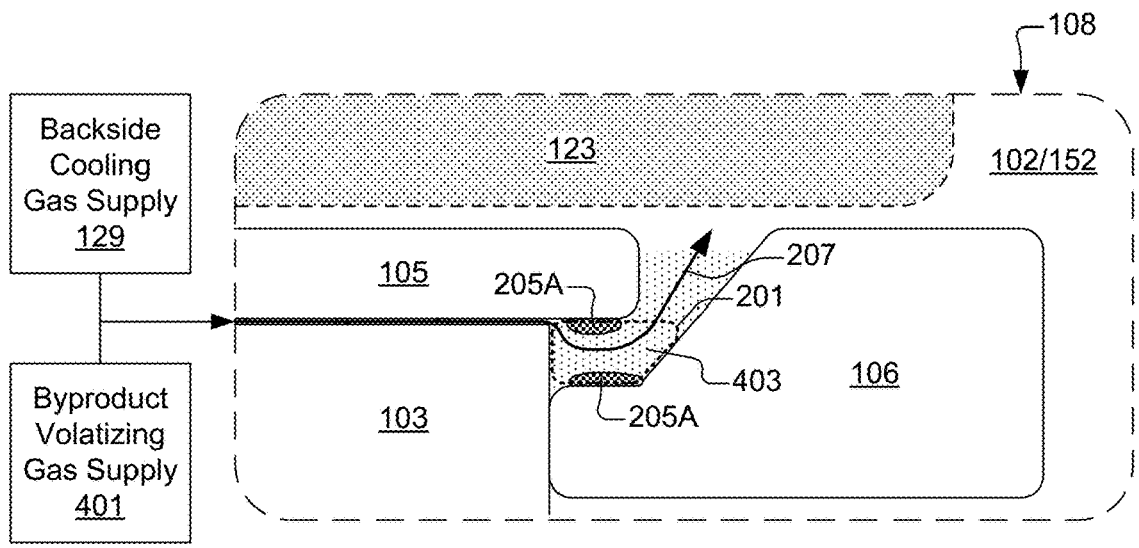
FIG. 4 shows the close-up view of the vertical cross-section through the region that includes the peripheral edge of the wafer, with a byproduct volatizing gas supplied to the lower peripheral open region by adding the byproduct volatizing gas to the wafer backside cooling gas, in accordance with some embodiments.

In some embodiments, operation 305 includes mixing the byproduct volatizing gas with a wafer backside cooling gas and supplying the resulting gas mixture to the lower peripheral open region 201. FIG. 4 shows the close-up view of the vertical cross-section through the region 108, as referenced in FIGS. 1A and 1B, that includes the peripheral edge 105A of the wafer 105, with a byproduct volatizing gas 403 supplied to the lower peripheral open region 201 by adding the byproduct volatizing gas 403 to the wafer backside cooling gas, in accordance with some embodiments. In some embodiments, the wafer backside cooling gas is helium. The byproduct volatizing gas 403 is supplied from a byproduct volatizing gas supply 401. For example, in some embodiments, at a location upstream of the one or more gas delivery ports 211 (see FIG. 2B) a flow of the byproduct volatizing gas 403 as supplied from the byproduct volatizing gas supply 401 is combined with a flow of the backside cooling gas as supplied from the backside cooling gas supply 129. In some embodiments, a flow rate of the byproduct volatizing gas 403 to the lower peripheral open region 201 is up to 25% of a total flow rate of a combination of the byproduct volatizing gas 403 and the wafer backside cooling gas to the lower peripheral open region 201. FIG. 4 also depicts a reduced amount of the byproduct material(s) 205A corresponding to reaction of the byproduct volatizing gas 403 with the byproduct material(s) 205A, thereby indicating management of the accumulation of the byproduct material(s) 205A so as to prevent electrical arcing, particle generation, and/or other adverse conditions.

Figure 5A:
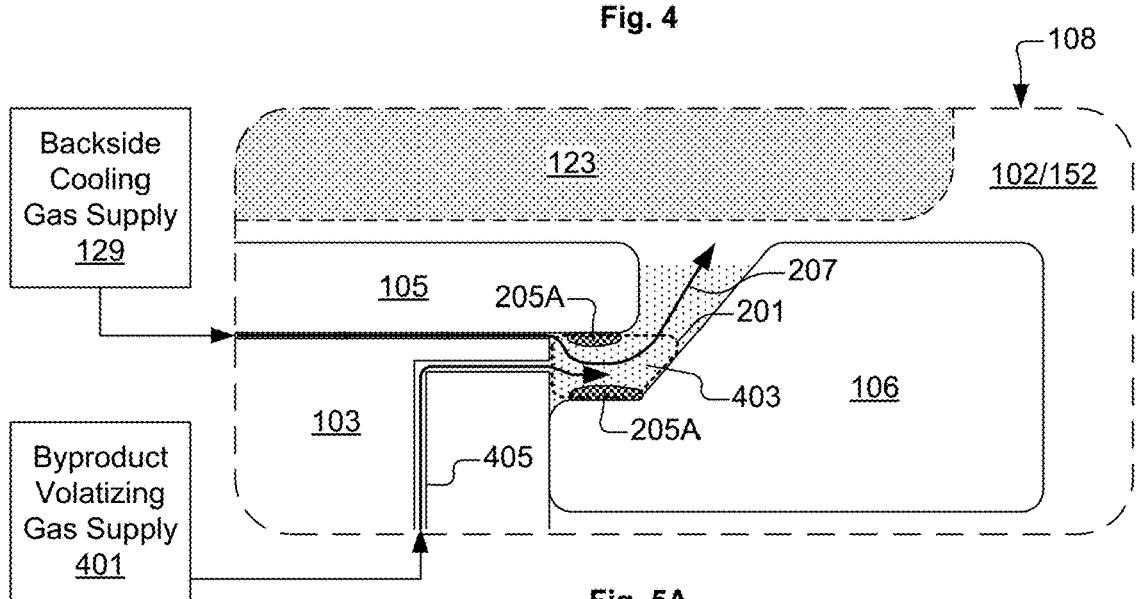
FIG. 5A shows the close-up view of the vertical cross-section through the region that includes the peripheral edge of the wafer, with the byproduct volatizing gas supplied to the lower peripheral open region through gas flow channels formed within the wafer support structure, in accordance with some embodiments.

In some embodiments, operation 305 includes supplying the byproduct volatizing gas to the lower peripheral open region 201 by dispensing the byproduct volatizing gas into the lower peripheral open region 201 from a byproduct volatizing gas delivery component. FIG. 5A shows the close-up view of the vertical cross-section through the region 108, as referenced in FIGS. 1A and 1B, that includes the peripheral edge 105A of the wafer 105, with the byproduct volatizing gas 403 supplied to the lower peripheral open region 201 through gas flow channels 405 formed within the wafer support structure 103, in accordance with some embodiments. In the example of FIG. 5A, the gas flow channels 405 collectively represent an example of the byproduct volatizing gas delivery component. The byproduct volatizing gas 403 is supplied to the gas flow channels 405 from the byproduct volatizing gas supply 401. In various embodiments, the gas flow channels 405 can be configured and routed to dispense the byproduct volatizing gas 403 into the lower peripheral open region 201 in a substantially uniform manner around the periphery of the wafer support structure 103. In the example of FIG. 5A, the byproduct volatizing gas 403 is supplied to the lower peripheral open region 201 separate from the backside cooling gas, with the byproduct volatizing gas 403 and the backside cooling gas meeting within the lower peripheral open region 201. In this manner, supply of the backside cooling gas to the region between the wafer 105 and the wafer support structure 103, as indicated by arrow 207, is not affected by supply of the byproduct volatizing gas 403 to the lower peripheral open region 201 through the gas flow channels 405. FIG. 5A also depicts the reduced amount of the byproduct material(s) 205A corresponding to reaction of the byproduct volatizing gas 403 with the byproduct material(s) 205A, thereby indicating management of the accumulation of the byproduct material(s) 205A so as to prevent electrical arcing, particle generation, and/or other adverse conditions.

Figure 5B:
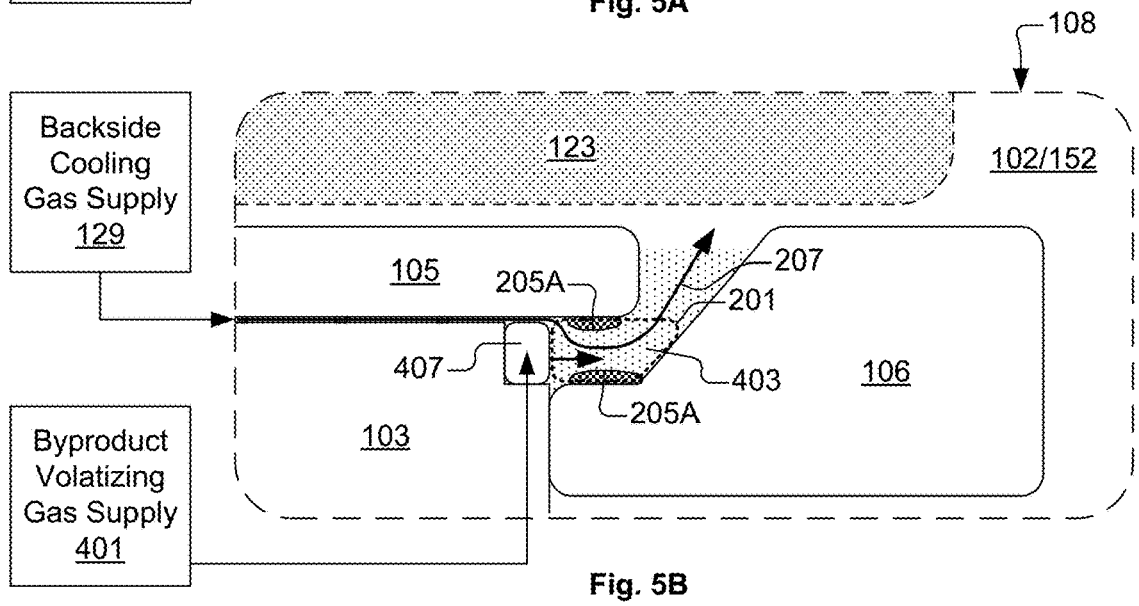
FIG. 5B shows the close-up view of the vertical cross-section through the region that includes the peripheral edge of the wafer, with the byproduct volatizing gas supplied to the lower peripheral open region through a gas supply ring, in accordance with some embodiments.
Figure 5C:
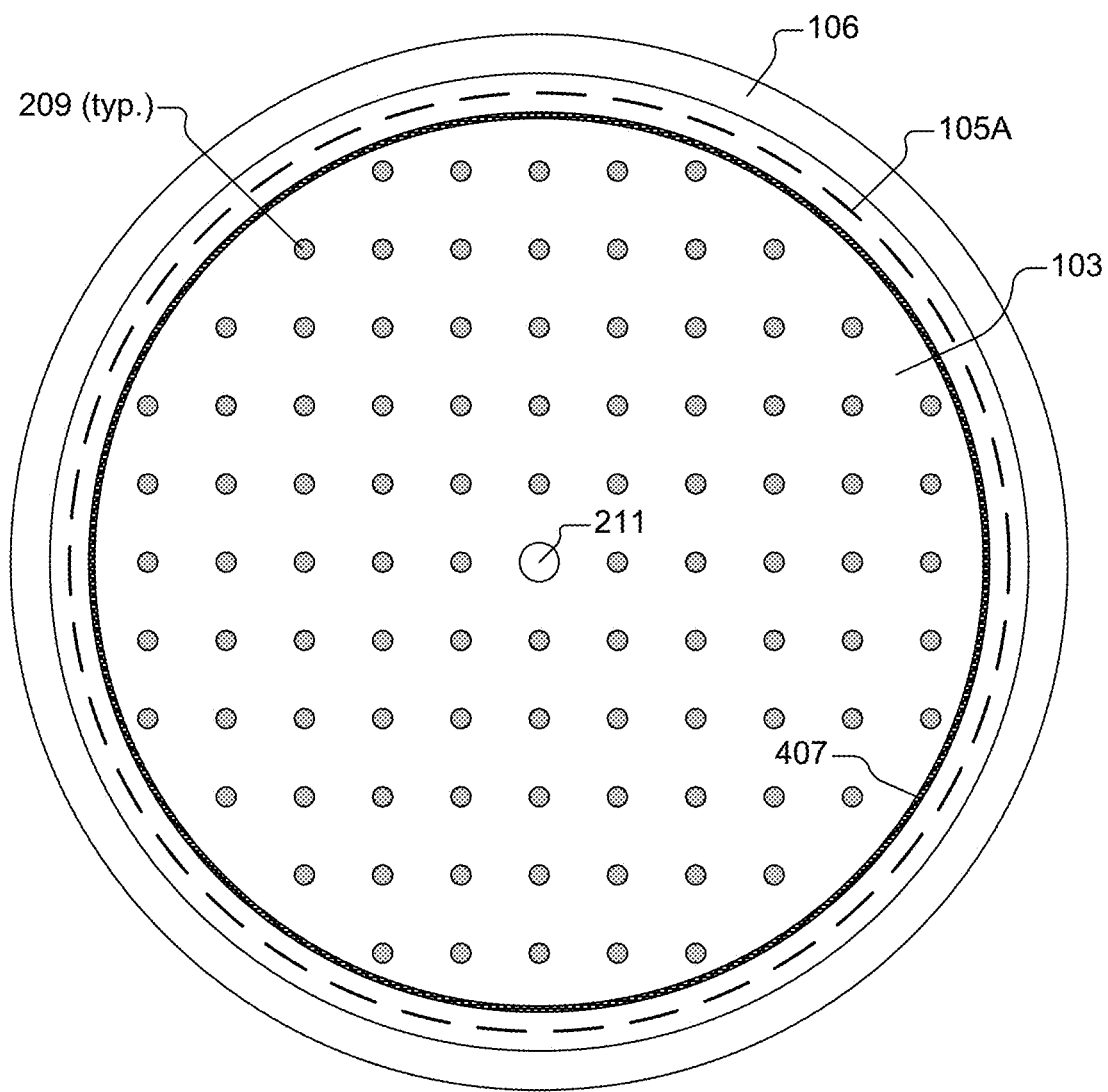
FIG. 5C shows the top view of the wafer support structure, with the edge ring structure positioned to circumscribe the wafer support structure, and with the gas supply ring configured to circumscribe the wafer support structure, in accordance with some embodiments.

FIG. 5B shows the close-up view of the vertical cross-section through the region 108, as referenced in FIGS. 1A and 1B, that includes the peripheral edge 105A of the wafer 105, with the byproduct volatizing gas 403 supplied to the lower peripheral open region 201 through a gas supply ring 407, in accordance with some embodiments. In the example of FIG. 5B, the gas supply ring 407 represents an example of the above-mentioned byproduct volatizing gas delivery component. FIG. 5C shows the top view of the wafer support structure 103, with the edge ring structure 106 positioned to circumscribe the wafer support structure 103, and with the gas supply ring 407 configured to circumscribe the wafer support structure 103, in accordance with some embodiments. The byproduct volatizing gas 403 is supplied to the gas supply ring 407 from the byproduct volatizing gas supply 401. In various embodiments, the gas supply ring 407 can be configured to dispense the byproduct volatizing gas 403 into the lower peripheral open region 201 in a substantially uniform manner around the periphery of the wafer support structure 103. In the example of FIG. 5B, the byproduct volatizing gas 403 is supplied to the lower peripheral open region 201 separate from the backside cooling gas, with the byproduct volatizing gas 403 and the backside cooling gas meeting within the lower peripheral open region 201. In this manner, supply of the backside cooling gas to the region between the wafer 105 and the wafer support structure 103, as indicated by arrow 207, is not affected by supply of the byproduct volatizing gas 403 to the lower peripheral open region 201 through the gas supply ring 407. FIG. 5B also depicts the reduced amount of the byproduct material(s) 205A corresponding to reaction of the byproduct volatizing gas 403 with the byproduct material(s) 205A, thereby indicating management of the accumulation of the byproduct material(s) 205A so as to prevent electrical arcing, particle generation, and/or other adverse conditions.

In some embodiments, a system for managing accumulation of byproduct material(s) 205 during a plasma-based semiconductor wafer fabrication process is disclosed. The system includes the wafer support structure 103 configured to support the wafer 105 during the plasma-based semiconductor wafer fabrication process. The system also includes the edge ring structure 106 configured to circumscribe the wafer support structure 103 such that the lower peripheral open region 201 exists between the edge ring structure 106 and the peripheral portion of the bottom surface of the wafer 105 when the wafer 105 is present on the wafer support structure 103. The system also includes the wafer backside cooling gas supply channel 126 formed within the wafer support structure 103. The wafer backside cooling gas supply channel 126 is configured to supply the backside cooling gas to the region between the wafer support structure 103 and the wafer 105 when the wafer 105 is present on the wafer support structure 103. The system also includes the backside cooling gas supply 129 configured to supply the backside cooling gas to the wafer backside cooling gas supply channel 126. The system also includes the byproduct volatizing gas supply 401 configured to supply the byproduct volatizing gas 403 to the wafer backside cooling gas supply channel 126, such that at least a portion of the backside cooling gas and at least a portion of the byproduct volatizing gas 403 flow together into the lower peripheral open region 201. The byproduct volatizing gas 403 is defined to control accumulation of the byproduct material(s) 205 within the lower peripheral open region 201 during the plasma-based semiconductor wafer fabrication process.

In some embodiments, another system for managing accumulation of byproduct material(s) 205 during a plasma-based semiconductor wafer fabrication process is disclosed. The system includes the wafer support structure 103 configured to support the wafer 105 during the plasma-based semiconductor wafer fabrication process. The system also includes the edge ring structure 106 configured to circumscribe the wafer support structure 103 such that the lower peripheral open region 201 exists between the edge ring structure 106 and the peripheral portion of the bottom surface of the wafer 105 when the wafer 105 is present on the wafer support structure 103. The system also includes a byproduct volatizing gas delivery component configured to dispense the byproduct volatizing gas 403 into the lower peripheral open region 201. The byproduct volatizing gas 403 is defined to control accumulation of the byproduct material(s) 205 within the lower peripheral open region 201 during the plasma-based semiconductor wafer fabrication process. The system also includes the byproduct volatizing gas supply 401 configured to supply the byproduct volatizing gas 403 to the byproduct volatizing gas delivery component. In some embodiments, the byproduct volatizing gas delivery component is defined by the gas flow channels 405 that are collectively configured and routed to dispense the byproduct volatizing gas 403 into the lower peripheral open region 201 in a substantially uniform manner around the periphery of the wafer support structure 103. In some embodiments, the byproduct volatizing gas delivery component is defined by the gas supply ring 407 configured to dispense the byproduct volatizing gas 403 into the lower peripheral open region 201 in a substantially uniform manner around the periphery of the wafer support structure 103.

As discussed herein, supplying the byproduct volatizing gas 403 directly at the location of byproduct material 205 accumulation during performance of the plasma-based fabrication process, e.g., etching process, on the wafer 105 is a solution for managing a thickness of byproduct material 205 on surfaces in the plasma processing chamber 101/151, and especially on surfaces of the edge ring structure 106 that are shaded from the plasma 123 by the wafer 105. In some embodiments, constant supply of the byproduct volatizing gas 403 to the lower peripheral open region 201 provides for control of byproduct material 205 accumulation on surfaces exposed to the lower peripheral open region 201. The methods and systems disclosed herein provide for direct control of byproduct material 205 accumulation during dielectric material plasma etching processes, and especially during dielectric material plasma etching processes of extended duration, such as in etching high aspect ratio features through thick material layer(s), e.g., etching channel holes through ONON and/or OPOP stacks during 3D NAND integrated circuit fabrication. Also, the methods and systems disclosed herein are particularly effective in managing byproduct material 205 accumulation during performance of plasma-based fabrication processes at low wafer support structure 103 temperatures, e.g., less than 0° C., where the byproduct material 205 includes an ammonium salt. Also, by enabling plasma etching at sub-zero (C) wafer support structure 103 temperatures, the methods and systems disclosed herein provide for higher etch rates and higher etch selectivity.

The byproduct material 205 accumulation management provided by methods and systems disclosed herein enables prevention of electrical arcing between the wafer 105 and the edge ring structure 106, which reduces a frequency of process alarms and helps improve wafer/chip yield and improves overall productivity of the plasma processing chamber 101/151. For example, the byproduct material 205 accumulation management provided by methods and systems disclosed herein improve productivity by enabling shorter productivity cycles and correspondingly longer wet clean cycles. Because the wet clean cycles can be longer, it is possible to achieve more robust cleaning efficiency of harder to etch/clean parts. Also, because the methods and systems disclosed herein provided for reduced accumulation of the byproduct materials 205, cleaning of the plasma processing chamber 101/151 between wafer 105 processing cycles can be completed faster, i.e., plasma processing chamber 101/151 dry clean time can be shortened, thereby increasing overall wafer 105 processing throughput of the plasma processing chamber 101/151. Additionally, because the methods and systems disclosed herein provide for reduced accumulation of the byproduct materials 205, it is possible to achieve a more effective cleaning of the plasma processing chamber 101/151 between wafer 105 processing cycles, which can lead to improvement in wafer 105 fabrication process stability by improving chamber defect and arcing performance (wafer-to-wafer) and by enabling better process reproducibility from wafer-to-wafer, which ultimately increases chip yield for the chip manufacturer.

Figure 6:
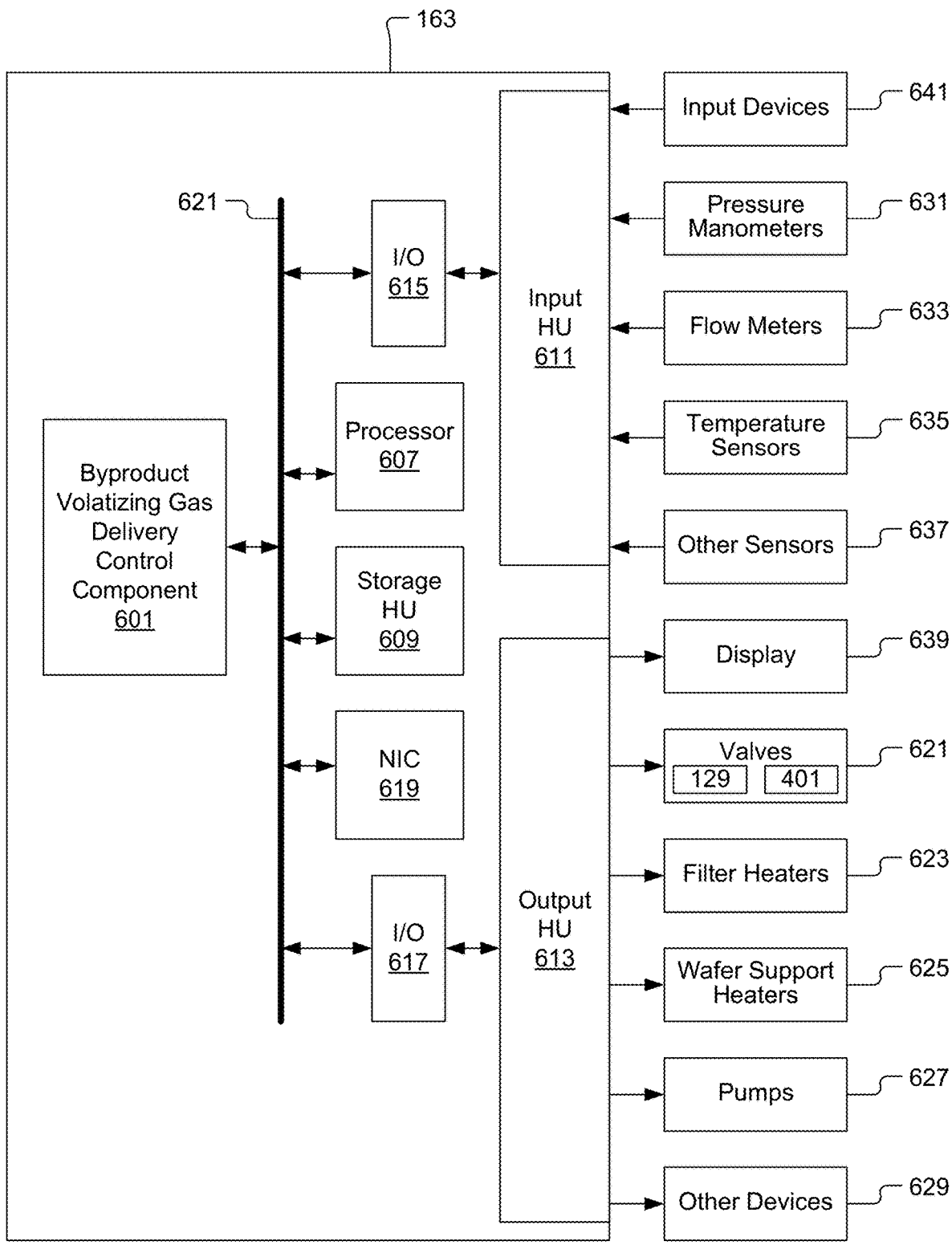
FIG. 6 shows an example schematic of the controller of FIGS. 1A and 1B, in accordance with some embodiments.

FIG. 6 shows an example schematic of the controller 163 of FIGS. 1A and 1B, in accordance with some embodiments. In some embodiments, the controller 163 is configured as a process controller for controlling the semiconductor fabrication process performed in either the CCP processing chamber 101 or the ICP processing chamber 151. The controller 163 includes a byproduct volatizing gas delivery control component 601 configured to control supply of the byproduct volatizing gas 403 to the lower peripheral open region 201 between the wafer 105 and the edge ring structure 106 during performance of the plasma-based fabrication process on the wafer 105.

In various embodiments, the controller 163 includes a processor 607, a storage hardware unit (HU) 609 (e.g., memory), an input HU 611, an output HU 613, an input/output (I/O) interface 615, an I/O interface 617, a network interface controller (NIC) 619, and a data communication bus 621. The processor 607, the storage HU 609, the input HU 611, the output HU 613, the I/O interface 615, the I/O interface 617, and the NIC 619 can be in data communication with each other by way of the data communication bus 621. The input HU 611 is configured to receive data communication from a number of external devices. Examples of the input HU 611 include a data acquisition system, a data acquisition card, etc. The output HU 613 is configured to transmit data to a number of external devices. An examples of the output HU 613 is a device controller. Examples of the NIC 619 include a network interface card, a network adapter, etc. Each of the I/O interfaces 615 and 617 is defined to provide compatibility between different hardware units coupled to the I/O interface. For example, the I/O interface 615 can be defined to convert a signal received from the input HU 611 into a form, amplitude, and/or speed compatible with the data communication bus 621. Also, the I/O interface 617 can be defined to convert a signal received from the data communication bus 621 into a form, amplitude, and/or speed compatible with the output HU 613. Although various operations are described herein as being performed by the processor 607 of the controller 163, it should be understood that in some embodiments various operations can be performed by multiple processors of the controller 163 and/or by multiple processors of multiple computing systems in data communication with the controller 163.

The controller 163 may be employed to control devices in various wafer fabrication systems based in-part on sensed values. For example, the controller 163 may control one or more of valves 621, filter heaters 623, wafer support structure heaters 625, pumps 627, and other devices 629 based on the sensed values and other control parameters. The valves 621 can include valves associated with control of the backside cooling gas supply 129 and the byproduct volatizing gas supply 401. The controller 163 receives the sensed values from, for example, pressure manometers 631, flow meters 633, temperature sensors 635, and/or other sensors 637. The controller 163 may also be employed to control process conditions during etching and deposition on the wafer(s).

The controller 163 can be configured to execute computer programs including sets of instructions for controlling process timing, process gas delivery system temperature, and pressure differentials, valve positions, mixture of gases, process gas flow rate, backside cooling gas flow rate, byproduct volatizing gas flow rate, chamber pressure, chamber temperature, wafer support structure temperature (wafer temperature), RF power levels, wafer chuck or pedestal position, bias power, and other parameters of a particular process. Other computer programs stored on memory devices associated with the controller 163 may be employed in some embodiments. Typically there will be a user interface associated with the controller 163. The user interface may include a display 639 (e.g., a display screen and/or graphical software displays of the apparatus and/or process conditions), and user input devices 641 such as pointing devices, keyboards, touch screens, microphones, etc.

Software for directing operation of the controller 163 may be designed or configured in many different ways. Computer programs for directing operation of the controller 163 to execute various wafer fabrication processes in a process sequence can be written in any conventional computer readable programming language: for example, assembly language, C, C++, Pascal, Fortran or others. Compiled object code or script is executed by the processor 607 to perform the tasks identified in the program. The controller 163 can be operated to control various process control parameters related to process conditions such as, for example, filter pressure differentials, process gas composition and flow rates, backside cooling gas composition and flow rates, byproduct volatizing gas composition and flow rates, temperature, pressure, plasma conditions, such as RF power levels and RF frequencies, bias voltage(s), cooling gas/fluid pressure, and chamber wall temperature, among others. Examples of sensors that may be monitored during the wafer fabrication process include, but are not limited to, mass flow control modules, pressure sensors, such as the pressure manometers 631, and thermocouples located in the wafer support structure, such as the temperature sensors 635. Appropriately programmed feedback and control algorithms may be used with data from these sensors to control/adjust one or more process control parameters to maintain desired process conditions.

In some implementations, the controller 163 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of the wafer. The controller 163 may control various components or subparts of the system or systems. The controller 163, depending on the processing requirements and/or the type of system, may be programmed to control any of the processes disclosed herein, including the delivery of processing gases, the delivery of backside cooling gases, the delivery of byproduct volatizing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 163 may be defined as electronics having various integrated circuits, logic, memory, and/or software that receive instructions, issue instructions, control operation, enable wafer processing operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 163 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 163, in some implementations, may be a part of or coupled to a computer that is integrated with, coupled to the system, otherwise networked to the system, or a combination thereof. For example, the controller 163 may be in the "cloud" of all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet.

The remote computer may include a user interface that enables entry or programming of parameters and/or settings, which are then communicated to the system from the remote computer. In some examples, the controller 163 receives instructions in the form of data, which specify parameters for each of the processing steps to be performed during one or more operations. It should be understood that the parameters may be specific to the type of process to be performed and the type of tool that the controller 163 is configured to interface with or control. Thus as described above, the controller 163 may be distributed, such as by comprising one or more discrete controllers that are networked together and working towards a common purpose, such as the processes and controls described herein. An example of a distributed controller for such purposes would be one or more integrated circuits on a plasma processing station in communication with one or more integrated circuits located remotely (such as at the platform level or as part of a remote computer) that combine to control a process on the plasma processing station.

Without limitation, example systems that the controller 163 can interface with may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers. As noted above, depending on the process step or steps to be performed by the tool, the controller 163 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Embodiments described herein may also be practiced with various computer system configurations including hand-held hardware units, microprocessor systems, microprocessor-based or programmable consumer electronics, minicomputers, mainframe computers and the like. Embodiments described herein can also be practiced in distributed computing environments where tasks are performed by remote processing hardware units that are linked through a network. It should be understood that the embodiments described herein can employ various computer-implemented operations involving data stored in computer systems. These operations are those requiring physical manipulation of physical quantities. Any of the operations described herein that form part of the embodiments are useful machine operations. The embodiments also relate to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

Various embodiments described herein can be implemented through process control instructions instantiated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes, and other optical and non-optical data storage hardware units. The non-transitory computer-readable medium can include computer-readable tangible medium distributed over a network-coupled computer system so that the computer-readable code is stored and executed in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A method for managing byproduct accumulation during a plasma-based semiconductor wafer fabrication process, comprising:
   positioning a wafer on a wafer support structure such that a peripheral portion of the wafer extends radially outward from an outer perimeter of a top surface of the wafer support structure to an outer perimeter of the wafer, and such that a lower peripheral open region is formed between the peripheral portion of the wafer and an edge ring structure that extends below the peripheral portion of the wafer without physically contacting the wafer, wherein the lower peripheral open region is exposed to a plasma generation region located above a top surface of the wafer;
   etching of a material on the top surface of the wafer by generating a plasma within the plasma generation region, the etching causing accumulation of byproduct material within the lower peripheral open region between a bottom surface of the peripheral portion of the wafer and the edge ring structure;
   supplying a flow of a byproduct volatizing gas through the lower peripheral open region while performing the etching, wherein the byproduct volatizing gas is formulated to undergo dissociation when exposed to reactive species of the plasma to create reactive species of the byproduct volatizing gas, wherein the byproduct volatizing gas includes substantially equal parts of oxygen ($O_2$) and either carbon dioxide ($CO_2$) or carbon monoxide (CO);
   exposing the byproduct volatizing gas within the lower peripheral open region to reactive species of the plasma while performing the etching to create reactive species of the byproduct volatizing gas within the lower peripheral open region, the reactive species of the byproduct volatizing gas interacting with the byproduct material accumulated within the lower peripheral open region to form a volatile material while performing the etching; and
   evacuating the volatile material from the lower peripheral open region through an exhaust gas flow while performing the etching.

2. The method as recited in claim 1, wherein the byproduct volatizing gas is supplied in a substantially constant manner during the etching.

3. The method as recited in claim 1, wherein the plasma is generated using a process gas that includes trifluoroiodomethane ($CF_3I$).

4. The method as recited in claim 1, wherein the plasma is generated using a process gas that includes one or more of trifluoroamine ($NF_3$), hydrogen ($H_2$), nitrogen ($N_2$), xenon (Xe), hydrogen bromide (HBr), sulfur hexafluoride ($SF_6$), octafluorocyclobutane (c-$C_4F_8$), hexafluoro-1,3-butadiene ($C_4F_6$), tetrafluoromethane ($CF_4$), difluoromethane ($CH_2F_2$), carbonyl sulfide (COS), methane ($CH_4$), oxygen ($O_2$), krypton (Kr), fluoromethane ($CH_3F$), and perfluoropropane ($C_3F_8$).

5. The method as recited in claim 1, further comprising:
   controlling a temperature of the wafer to be within a range extending up to about 0° Celsius.

6. The method as recited in claim 1, wherein the material on the top surface of the wafer that is etched is a dielectric material.

7. The method as recited in claim 1, wherein the byproduct material includes a polymer material, and the byproduct volatizing gas includes oxygen ($O_2$).

8. The method as recited in claim 1, wherein the byproduct volatizing gas is mixed with a wafer backside cooling gas and supplied to the lower peripheral open region.

9. The method as recited in claim 8, wherein the wafer backside cooling gas is helium.

10. The method as recited in claim 1, wherein a flow rate of the byproduct volatizing gas to the lower peripheral open region is up to 25% of a total flow rate of a combination of the byproduct volatizing gas and a wafer backside cooling gas to the lower peripheral open region.

11. The method as recited in claim 1, wherein the byproduct volatizing gas is supplied to the lower peripheral open region separately from a wafer backside cooling gas.

12. The method as recited in claim 1, further comprising:
   controlling a temperature of the wafer to be within a range extending from about −60° Celsius to about +80° Celsius.

13. The method as recited in claim 1, further comprising:
   controlling a temperature of the wafer to be within a range extending from about −100° Celsius to about 0° Celsius.

14. The method as recited in claim 1, further comprising:
   controlling a temperature of the wafer to be within a range extending from about −60° Celsius to about −20° Celsius.

15. The method as recited in claim 1, further comprising:
   controlling a temperature of the wafer support structure to be less than about 0° Celsius.

16. The method as recited in claim 1, wherein the byproduct material includes an ammonium salt, and wherein the reactive species of the byproduct volatizing gas interacts with the ammonium salt to form the volatile material.

17. A method for managing byproduct accumulation during a plasma-based semiconductor wafer fabrication process, comprising:
   positioning a wafer on a wafer support structure such that a peripheral portion of the wafer extends radially outward from an outer perimeter of a top surface of the wafer support structure to an outer perimeter of the wafer, and such that a lower peripheral open region is formed between the peripheral portion of the wafer and an edge ring structure that extends below the peripheral portion of the wafer without physically contacting the wafer, wherein the lower peripheral open region is exposed to a plasma generation region located above a top surface of the wafer;

etching of a material on the top surface of the wafer by generating a plasma within the plasma generation region, the etching causing accumulation of byproduct material within the lower peripheral open region between a bottom surface of the peripheral portion of the wafer and the edge ring structure;

supplying a flow of a byproduct volatizing gas through the lower peripheral open region while performing the etching, wherein the byproduct volatizing gas is formulated to undergo dissociation when exposed to reactive species of the plasma to create reactive species of the byproduct volatizing gas, wherein the byproduct volatizing gas includes either carbon dioxide ($CO_2$) or carbon monoxide (CO), and wherein the byproduct material is an ammonium salt;

exposing the byproduct volatizing gas within the lower peripheral open region to reactive species of the plasma while performing the etching to create reactive species of the byproduct volatizing gas within the lower peripheral open region, the reactive species of the byproduct volatizing gas interacting with the byproduct material accumulated within the lower peripheral open region to form a volatile material while performing the etching; and evacuating the volatile material from the lower peripheral open region through an exhaust gas flow while performing the etching.

18. The method as recited in claim 17, wherein the ammonium salt is one or more of ammonium fluoride ($NH_4F$), ammonium iodide ($NH_4I$), ammonium hexafluorosilicate (($NH_4)_2SiF_6$), ammonium bromide ($NH_4Br$), ammonium chloride ($NH_4Cl$), and ammonium bifluoride ($NH_4HF_2$).

* * * * *